United States Patent [19]

Itoh

[11] Patent Number: 4,839,196

[45] Date of Patent: Jun. 13, 1989

[54] PHOTOCHEMICAL FILM-FORMING METHOD

[75] Inventor: Hiromi Itoh, Itami, Japan

[73] Assignee: Mitsubishi Denki Kabushiki Kaisha, Tokyo, Japan

[21] Appl. No.: 134,570

[22] Filed: Dec. 14, 1987

Related U.S. Application Data

[63] Continuation of Ser. No. 820,040, Jan. 21, 1986, abandoned.

[30] Foreign Application Priority Data

Mar. 19, 1985 [JP] Japan ................... 60-57359

[51] Int. Cl.$^4$ ............................................. C23C 16/00
[52] U.S. Cl. ................... 427/53.1; 427/54.1; 427/55; 118/722; 118/620
[58] Field of Search ........... 427/53.1, 54.1, 55; 118/722, 620

[56] References Cited

U.S. PATENT DOCUMENTS

| | | | |
|---|---|---|---|
| 4,260,649 | 4/1981 | Denison | 427/53.1 |
| 4,340,617 | 7/1982 | Deutsch et al. | 118/50.1 |
| 4,581,248 | 4/1986 | Roche | 118/725 |
| 4,694,777 | 9/1987 | Roche | 427/54.1 |

FOREIGN PATENT DOCUMENTS 0128265  7/1985  Japan .

OTHER PUBLICATIONS

Chuang, J. Chem. Phys. 74(2), Jan. 15, 1981 pp. 1453-1460.
"Laser-Induced Chemical Vapor Deposition of SiO$_2$", P. K. Boyer et al., Boyer et al., Appl. Phys. Lett. 40 (8), 15, Aprl. 1985, pp. 716-718.

*Primary Examiner*—Richard Bueker
*Attorney, Agent, or Firm*—Lowe, Price, Leblanc, Becker & Shur

[57] ABSTRACT

An apparatus for photochemically forming a film on a substrate using a photo-induced chemical vapor deposition method comprises an optical lens through which a light beam is radiated to a reactive atmosphere gas to deposit and grow a film uniform in thickness on a substrate.

2 Claims, 1 Drawing Sheet

PHOTOCHEMICAL FILM-FORMING METHOD

This application is a continuation of application Ser. No. 820,040 filed Jan. 21, 1986 now abandoned.

BACKGROUND OF THE INVENTION

1. Field of the Invention

This invention relates to a photochemical film forming apparatus which forms a film on the surface of a substrate by radiating a light beam to photochemically dissociate a reactive atmosphere gas, and more particularly it relates to a photochemical film-forming apparatus adapted to deposit and grow a film of uniform thickness along the direction of travel of the light beam.

2. Description of the Prior Art

Film-forming techniques include a CVD (chemical vapor deposition) method based on plasma excitation. This plasma-excited CVD method uses a lower process temperature than that in the conventional CVD method and provides better step coverage than does the deposition based on physical methods such as evaporation and sputtering, these features accounting for its wide use. On the other hand, however, the plasma-excited CVD method has disadvantages such as ion-attack on the surface of the deposited film.

Thus, in recent years, a CVD method based on optical excitation (photo-induced CVD method) has been developed. This photo-induced CVD method operates on the principle of irradiating an atmosphere gas with a light beam to activate the atmosphere gas to accelerate its photochemical reaction, the resulting reaction product being deposited on the substrate.

FIG. 1 is a schematic view showing the relative disposition of a light beam and a substrate in a conventional photochemical film-forming apparatus using the photo-induced CVD method. In FIG. 1, a substrate 3 is held on a susceptor 4 to be exposed to an atmosphere gas. A deposition film will be formed on the main surface of the substrate 3. A light beam 1a for exciting the atmosphere gas is radiated from a light beam generator (not shown) and travels through an incident window 2 along a direction parallel to the main surface of the substrate 3. The distance between the light beam 1a and the substrate 3 is usually a few millimeters and typically 1-2 mm. The film-forming method will now be described.

The light beam 1a passes through the incident window 2 and irradiates the reactive gas of the atmosphere gas. Then, only the reactive gas molecules present in the path of travel of the light beam 1a absorb the light beam energy to be photochemically dissociated. The resulting reaction product from this photochemical reaction deposits on the surface of the substrate 3 immediately below the beam to form a film.

FIG. 2 is a graph showing how the rate of deposition of the film on the substrate changes when the arrangement shown in FIG. 1 is used. In FIG. 2, the horizontal axis indicates the distance measured in the direction of travel of the light beam, and the vertical axis indicates the rate of deposition of the film on the substrate. As can be seen from FIG. 2, the rate of deposition of the film on the substrate greately decreases along the direction of travel of the light beam. The reason is as follows.

The reactive gas (atmosphere gas) absorbs the incident light beam energy and is photochemically dissociated in accordance with the intensity of the incident light beam. On the other hand, however, as a result of the absorption of the light beam by the reactive atmosphere gas, the intensity of the light beam exponentially decreases as the light beam travels, according to the Lambert-Beer law expressed by the relation, $I(x) = I_0 \exp(-x/\alpha)$, where $I_0$ is the initial intensity of the light, $\alpha$ is the absorption factor, and $x$ is a distance along the travelling direction of the light. With this decrease in the light beam intensity, the extent to which the photochemical reaction is induced decreases, so that the amount of reaction product decreases and so does the rate of deposition.

A photochemical film-forming apparatus and film forming method of prior art is disclosed in P. K. Boyer et al., "Laser-Induced Chemical Vapor Deposition of $SiO_2$", Appl. Phys. Lett. 40 (8), 15 Apr. 1982, pp. 716–718.

However, the aforesaid prior art has given no consideration to the uniformity of the rate of deposition of the film on the substrate.

SUMMARY OF THE INVENTION

Accordingly, a object of the invention is to provide a photochemical film-forming apparatus which eliminates the aforesaid drawbacks and which is designed to attain a uniform rate of deposition all over the surface of a substrate.

A photochemical film-forming apparatus according to this invention is adapted to radiate a light beam through a light beam focusing means to a reactive atmosphere gas.

The focal point of the light beam focusing means, preferably an optical lens, is positioned in the vicinity of the region where the film deposition rate in the prior art apparatus is at a minimum. Further, the light beam focusing means is movable at least in the direction of travel of the light beam.

The extent to which the photochemical reaction is induced depends largely on the power density of the incident light beam. The power density of the light beam, in turn, depends largely on the beam diameter. Therefore, the provision of said means makes it possible to compensate for a decrease in the incident light beam intensity due to the absorption of light by a reactive gas, in the region where the deposition rate decreases in the conventional apparatus by decreasing the beam diameter to increase the power density of the light beam. That is, it is possible to obtain a uniform deposited film in thickness over the entire surface of the substrate.

This object and other objects and features of the invention will become more apparent from the following detailed description to be given with reference to the accompanying drawings.

DESCRIPTION OF THE PREFERRED EMBODIMENTS

Figure 1:
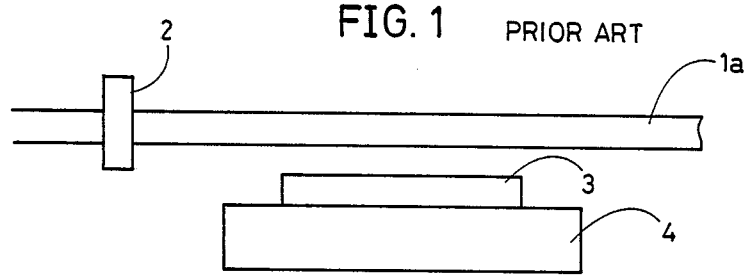
FIG. 1 is a view schematically showing the relative positional relation between a light beam and a substrate in a conventional photochemical film-forming apparatus.
Figure 2:
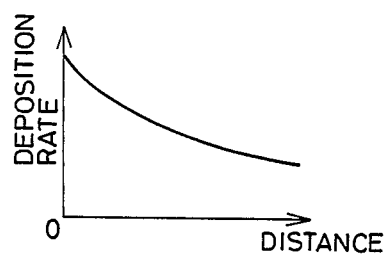
FIG. 2 is a graph showing how the rate of deposition of the film on the substrate depends on the distance measured on the substrate in the direction of travel of the light beam in the conventional photochemical film-forming apparatus.
Figure 3:
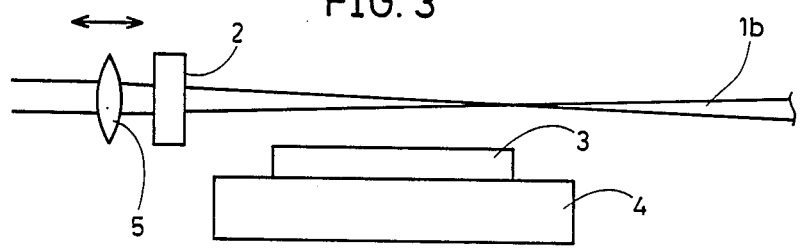
FIG. 3 is a view schematically showing the relative positional relation between a light beam and a substrate in a photochemical film-forming apparatus according to an embodiment of the invention.
Figure 4:
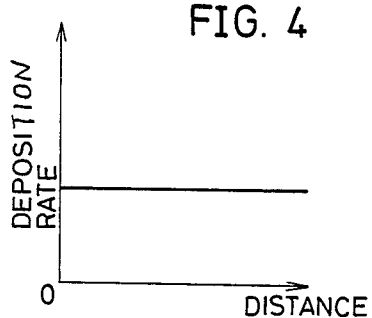
FIG. 4 is a graph showing how the rate of deposition of the film on the substrate depends on the distance measured on the substrate in the direction of travel of the light beam, in the photochemical film-forming apparatus according to the embodiment of the invention.

FIG. 3 is a view showing the relative disposition of the incident light beam and a substrate in a photochemical film-forming apparatus according to the invention. In FIG. 3, a light beam 1b is radiated through a condensing lens 5 and an incident window 2 to a reactive gas which is an atmosphere gas. The focal point of the condensing lens 5 is positioned so that it is located in the region where the deposition rate decreases in the conventional apparatus shown in FIG. 1. A substrate 3 on which a deposition film will be formed is held on a susceptor 4. The light beam 1b travels in a direction parallel to the substrate 3 and the distance there between is typically 1-2 mm. The film forming process using the arrangement shown in FIG. 3 will now be described.

The film forming process is the same with that of the conventional photo-induced CVD method. However, in the present invention the light beam 1b is radiated from a light beam generator (not shown) through the condensing lens 5 to the reactive gas. The focal point of the condensing lens 5 is located in the deposition-rate-decreasing region in the arragement of the conventional apparatus having no lens shown in FIG. 1. Preferably, it is located in the vicinity of the position at which the deposition rate is at minimum. Therefore, the beam diameter in this region is decreased and hence the beam power density is increased, thus compensating for the decrease in the power density of the light due to the absorption of light by the reactive gas to ensure that the beam power density along the direction of travel of the light beam is constant. As a result, the extent to which the photochemical reaction is induced along the direction of travel of the light beam 1b becomes constant, so that a uniform deposition rate and hence a uniform deposited film thickness are obtained along the direction of travel of the beam.

In addition, if the position of the condensing lens 5 is made variable, it is possible to vary the position of the maximum power density, and therefore the distribution of the thickness of the film deposited on the substrate 3, as desired.

As has been so far described, in this invention, light beam focusing means is used for radiating a light beam to a reactive atmosphere gas. Therfore, the decrease in the light intensity due to the absorption of light by the reactive gas can be compensated for by the decreased beam diameter; thus, a deposited film of uniform thickness over the entire surface of the substrate can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for forming a film of uniform thickness on a main surface of a substrate, comprising:
    (a) providing a substrate having a main surface in a reactive gas atmosphere; and
    (b) radiating a light beam through a light beam focusing means to the reactive gas atmosphere and along the length of but not intersecting the main surface of the substrate, the light beam photochemically dissociating the reactive gas to form a reaction product which is deposited on the main surface of the substrate, and the focal point of the focusing means being positioned adjacent the main surface of the substrate where the intensity of the light beam would otherwise be at a minimum owing to a decrease in intensity of the light beam along its direction of irradiation if the light beam were not radiated through any focusing means.

2. A method as defined by claim 1, wherein the light beam focusing means comprises an optical lens.

* * * * *